United States Patent
Suzuki (10) Patent No.: US 7,456,516 B2
(45) Date of Patent: Nov. 25, 2008

(54) POWER LINE TERMINATING CIRCUIT AND METHOD, AND POWER LINE RELAY DEVICE

(75) Inventor: Mitsunari Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 449 days.

(21) Appl. No.: 10/550,147

(22) PCT Filed: Mar. 26, 2004

(86) PCT No.: PCT/JP2004/004335
§ 371 (c)(1),
(2), (4) Date: Sep. 21, 2005

(87) PCT Pub. No.: WO2004/088872
PCT Pub. Date: Oct. 14, 2004

(65) Prior Publication Data
US 2006/0214507 A1   Sep. 28, 2006

(30) Foreign Application Priority Data
Mar. 28, 2003   (JP) .............................. 2003-092843

(51) Int. Cl.
*H02J 3/02* (2006.01)
*G05B 11/01* (2006.01)
(52) U.S. Cl. .................. 307/3; 307/DIG. 1; 340/310.13
(58) Field of Classification Search ...................... 307/3, 307/1, DIG. 1
See application file for complete search history.

(56) References Cited

U.S. PATENT DOCUMENTS 6,177,849 B1 *   1/2001   Barsellotti et al. .......... 333/177
6,987,430 B2 *   1/2006   Wasaki et al. ............... 333/124

FOREIGN PATENT DOCUMENTS

| JP | U 44-19900 | 8/1969 |
| JP | U 52-156416 | 11/1977 |
| JP | U 55-66459 | 5/1980 |

(Continued)

*Primary Examiner*—Michael J Sherry
*Assistant Examiner*—Michael Rutland Wallis
(74) *Attorney, Agent, or Firm*—Oliff & Berridge, PLC (57) ABSTRACT

The present invention provides a power line terminating circuit and method and a power line relay device for setting indoor power lines to a state adapted to communications by making impedances match each other irrespective of a device connected, thereby enabling noise entering from an electric device to the power lines to be reduced. By a capacitor (33) provided between connection ends (35A) and (35B) and an inductor (34) provided between a termination (32A) of an indoor power line (1A) and the connection end (35A), a series resonance circuit having a series resonance point in a frequency band which is higher than a frequency of a power source voltage and is lower than a communication frequency band is configured. A resistor (31) having a resistance value corresponding to a characteristic impedance of the indoor power line (1A) and an indoor power line (1B) is provided in parallel with the inductor (34). Irrespective of the presence or absence and the kind of a load (electric device (5)), an input impedance of a power line terminating circuit (30U) is made constant in the communication frequency band and reflection caused by impedance mismatching at the terminations of the power lines can be prevented. Thus, communication quality of the power line communication can be maintained.

10 Claims, 7 Drawing Sheets

FOREIGN PATENT DOCUMENTS

| | | |
|---|---|---|
| JP | A 61-278221 | 12/1986 |
| JP | B2 1-24448 | 5/1989 |
| JP | U 1-135836 | 9/1989 |
| JP | A 2002-217797 | 8/2002 |
| JP | A-2003-503148 | 1/2003 |
| JP | A 2003-264486 | 9/2003 |

* cited by examiner

POWER LINE TERMINATING CIRCUIT AND METHOD, AND POWER LINE RELAY DEVICE

TECHNICAL FIELD

The present invention relates to a power line terminating circuit and method applied to an indoor power line on which an AC power voltage and a high frequency signal of a communication frequency band are superimposed and, to a power line relay device for relaying a terminating end of such an indoor power line and an electric device.

BACKGROUND ART

In recent years, to share peripheral devices of a computer, share information of document, still pictures, motion pictures, and the like, games, the Internet, and the like, needs for information communication at home are being grown. Consequently, communication networks are in demand not only in offices but also at home.

Recently, the power line communication technique is regarded as a promising technique as a communication technique used at the time of configuring a communication network in a house, and is being developed. The power line communication technique uses the indoor power line as a signal transmission path and is realized by using, for example, an indoor power line as shown in FIG. 12.

Figure 12:
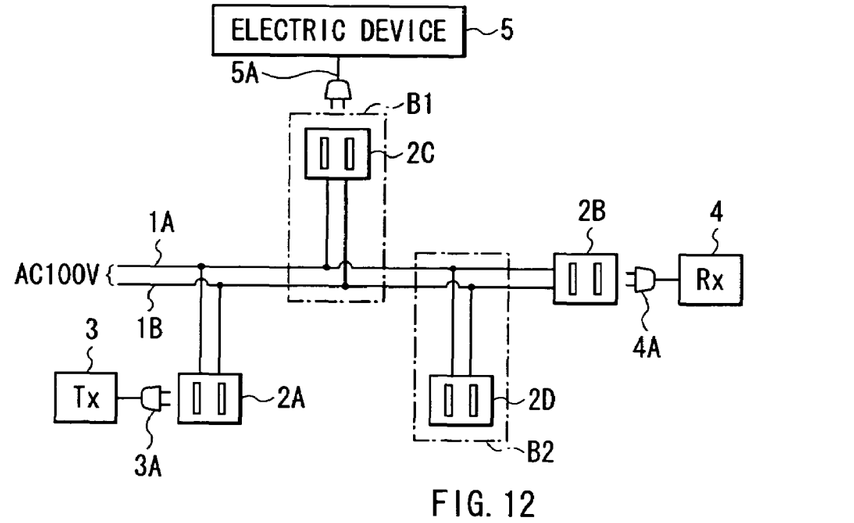
FIG. 12 is a diagram showing an indoor power line wiring state of a general house.

As shown in FIG. 12, a power source plug 3A of a transmitter 3 is connected to a connection part (hereinbelow, called outlet) 2A connected at the terminating end of each of a pair of indoor power lines 1A and 1B, and a power source plug 4A of a receiver 4 is connected to the other outlet 4A. The transmitter 3 and the receiver 4 can operate by supplying with power of a commercial power source from the indoor power lines 1A and 1B, and have modems (modulator/demodulator) for power line communication. In the case of performing power line communication, the transmitter 3 modulates a transmission signal to a high-frequency communication signal by using carrier waves of frequency sufficiently higher than the frequency of the commercial power source by a built-in modem, superimposes the communication signal on an AC voltage on the indoor power lines 1A and 1B, and transmits the resultant to the receiver 4.

When the technique is used, for example, only by connecting plural communication devices having communication function (for example, a personal computer, a household electrical appliance with the communication function, and the like) to outlets installed in rooms of a house, communications can be performed among the communication devices. Recently, high-speed communication techniques in a higher frequency band are developed, and commercialization of a home communication network using a high-speed communication technique and a power line communication technique is in demand.

However, the indoor power line is inherently not installed as a communication line, so that the environment is not always adapted to communication. For example, in FIG. 12, when electric devices are not connected to outlets 2C and 2D for connecting electric devices to the indoor power lines 1A and 1B, branch parts B1 and B2 including the outlets 2C and 2D, respectively, become a so-called open stub state, and an adverse influence is exerted on communication quality. That is, the outlets 2C and 2D become open ends (high impedance) where reflection of the high frequency signal occurs, so that a communication signal deteriorates.

Also in a state where a power source plug 5A of an electric device 5 is connected to the outlet 2C, in the case where the input impedance of the electric device 5 is different from the characteristic impedances of the indoor power lines 1A and 1B, reflection of the high frequency signal occurs in the portion of the outlet 2C, and a communication signal deteriorates.

From the above viewpoint, for example, Japanese Patent Laid-open No. 2002-217797 proposes a power line terminating circuit in which an impedance matching circuit is provided between the indoor power lines 1A and 1B and the electric device 5, and an inductor for checking passage of signals and noises is provided between the indoor power lines 1A and 1B and the electric device 5.

Figure 13:
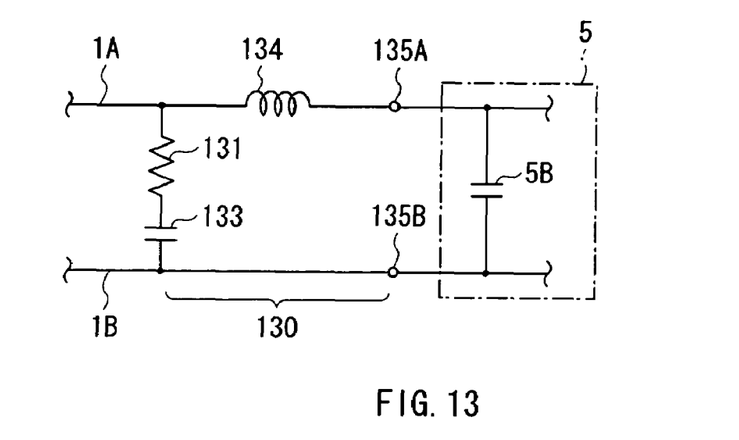
FIG. 13 is a diagram showing the configuration of a conventional power line terminating circuit.

A terminating circuit 130 described in Japanese Patent Laid-open No. 2002-217797 includes, as shown in FIG. 13, a resistor 131 and a capacitor 133 connected in series between the pair of indoor power lines 1A and 1B, and an inductor (coil) 134 connected between one end side (side connected to the indoor power lines 1A and 1B) of a resistor 131 and the electric device 5 as a load. The resistance value of the resistor 131 is set substantially equal to the characteristic impedance of the indoor power lines 1A and 1B. A pair of terminals 135A and 135B is socket terminals to which the power source plug 5A of the electric device 5 is plugged in. Via the power source plug 5A, commercial AC power is supplied to the electric device 5. Both ends of the resistor 131 serve as input/output terminals of high frequency signals used for communication. A capacitor 5B is a capacitor of a line filter provided at the input stage of the electric device 5 to be connected to the terminals 135A and 135B or a parasitic line-capacitance of wiring in the electric device 5.

Japanese Patent Laid-open No. 2002-217797 describes that by disposing the resistor 131 having a resistance value equal to the characteristic impedance of the indoor power lines 1A and 1B, the characteristic impedance of the indoor power lines 1A and 1B and the input impedance of the electric device 5 are matched, and attenuation accompanying the reflection of the high frequency signal can be prevented.

Figure 14:
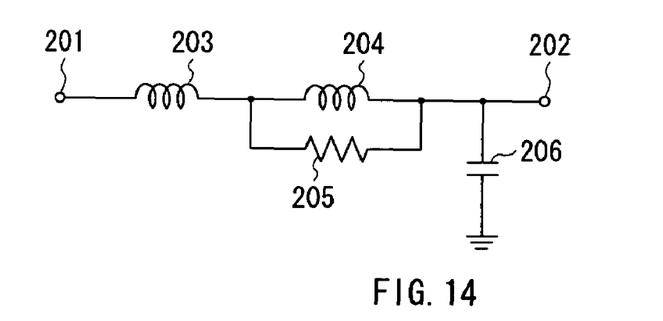
FIG. 14 is a circuit diagram showing the configuration of a conventional noise filter.

Although not directly related to the field of the power line communication technique, for example, Japanese Patent Publication No. Hei 1-24448 discloses a noise filter having narrow pulse width and high energy density and capable of removing noise. The noise filter has, as shown in FIG. 14, a first coil (inductor) 203 and a second coil 204 connected in series between an input terminal 201 and an output terminal 202, a resistor 205 connected in parallel with the second coil 204, and a capacitor 206 connected between the output terminal 202 and the ground. Japanese Patent Publication No. Hei 1-24448 describes that noise of a narrow pulse width is removed by a CR low-pass filter configured by the resistor 205 and the capacitor 206 whereas a power source voltage and a signal including no noise can be passed as they are and supplied to an apparatus (not shown) connected to the output terminal 202.

The technique described in Japanese Patent Laid-open No. 2002-217797 still has, however, a problem which occurs when a general electric device is connected to the terminating circuit 130 for the following reason. As described above, in a general electric device, a line filter using a capacitor is usually included at an input stage. In this case, the branch parts B1 and B2 (FIG. 12) enter a so-called short stub state. Specifically, since series resonance is generated by the capacitor 5B in the line filter on the electric device side and the inductor 134 in the terminating circuit, in the case where the resonance frequency is in the communication frequency band, the input impedance of the terminating circuit becomes lower than the characteristic impedance of the power line. As a result, reflection occurs in the power line terminating circuit, and the communication signal deteriorates.

Also in the case where the capacitor of the line filter is not provided in the input stage of the electric device 5, as shown in FIG. 13, the parasitic line-capacitance of wiring in an electric device to be connected exists, so that a similar problem may occur.

To avoid the influence of the capacitor in the line filter and the parasitic line-capacitance of the wiring in the electric device in such a circuit configuration, there is also a method of setting the inductor 134 to have a very large value. This method, however, has a problem such that the size of the terminating circuit becomes large.

On the other hand, in the noise filter described in Japanese Patent Publication No. Hei 1-24448, the second coil (inductor) 204 is provided in series with the resistor 205. Consequently, when the frequency of a signal increases, the input impedance of the noise filter increases and cannot be maintained to be constant. Therefore, in the case of simply applying the noise filter to the terminating end of the power line, there is the possibility that impedance matching cannot be obtained with respect to the high frequency signal, and reflection occurs.

In any of the conventional techniques, it is difficult to realize a power line terminating circuit adapted to power line communications.

DISCLOSURE OF THE INVENTION

The present invention has been achieved in consideration of the problems and a first object of the invention is to provide a power line terminating circuit and method and a power line relay device which solve the problem of impedance matching irrespective of a device to be connected and which can maintain indoor power lines in a state adapted to communications with a compact configuration. A second object of the invention is to provide a power line terminating circuit and method and a power line relay device capable of effectively reducing the influence of noise from an electric device connected to a power line to the power line.

According to the invention, there is provided a power line terminating circuit provided at terminations of a pair of indoor power lines where a high frequency signal in a communication frequency band is superimposed on an AC power source voltage, including: a first capacitor provided between the pair of indoor power lines to suppress fluctuations of a capacitive load in an electric device connected to the terminations of the indoor power lines; one or more inductors provided on the indoor power lines and configuring a series resonance circuit in cooperation with the first capacitor; and one or more resistors provided in parallel with each of the inductors and having a resistance value corresponding to a characteristic impedance of the indoor power lines, wherein the series resonance circuit has a series resonance point in a frequency band which is higher than a frequency of the AC power source voltage and is lower than the communication frequency band. "The series resonance circuit has a series resonance point in a frequency band which is higher than a frequency of the AC power source voltage and is lower than the communication frequency band" denotes that a resonance frequency of the series resonance circuit is higher than the frequency of the AC power source voltage and is lower than the communication frequency band. The meaning is the same below.

A power line terminating method of the invention is a method of terminating a pair of indoor power lines where a high frequency signal in a communication frequency band is superimposed on an AC power source voltage, comprising the steps of: providing a first capacitor between the pair of indoor power lines, the first capacitor suppressing fluctuations of a capacitive load in an electric device connected to the terminations of the indoor power lines; providing one or more inductors on the indoor power lines, the one or more inductors configuring a series resonance circuit in cooperation with the first capacitor; and providing one or more resistors in parallel with each of the inductors, the one or more resistors having a resistance value corresponding to a characteristic impedance of the indoor power lines. The series resonance circuit has a series resonance point in a frequency band which is higher than a frequency of the AC power source voltage and is lower than the communication frequency band.

In the power line terminating circuit and method of the present invention, a series resonance circuit is configured by the first capacitor and the inductor. Since the series resonance circuit has a series resonance point in a frequency band which is higher than a frequency of the AC power source voltage and is lower than the communication frequency band, an input impedance of the power line terminating circuit in the communication frequency band is equal to the resistance value of the resistor provided in parallel with the inductor. Since the resistance value of the resistor is preset to a value corresponding to the characteristic impedance of the indoor power lines, in the communication frequency band, the input impedance of the power line terminating circuit is equal to the characteristic impedance of the indoor power lines. Consequently, a high frequency communication signal in the communication frequency band is not reflected at the termination of the indoor power lines.

In the power line terminating circuit and method of the invention, preferably, an impedance of the inductor at the lower limit frequency of the communication frequency band is equal to or larger than twice of the resistance value of the resistor for the reason that the resistor provided in parallel with the inductor functions as a reliably for the high frequency signal.

The power line terminating circuit and method of the invention can employ an unbalanced type (asymmetrical type) in which the inductor is provided on only one of the pair of indoor power lines. Preferably, the power line terminating circuit further includes a second capacitor provided in series with the resistor and configuring a parallel resonance circuit in cooperation with the inductor. The parallel resonance circuit has a parallel resonance point in a frequency band which is higher than the series resonance point and is lower than the communication frequency band. Since the parallel resonance circuit configured by the second capacitor and the inductor has the parallel resonance point in a frequency band which is higher than the resonance point of the series resonance circuit configured by the first capacitor and the inductor and is lower than the communication frequency band, the frequency at which the input impedance of the power line terminating circuit reaches a predetermined value (the resistance value of the resistor) shifts to the lower side. As a result, the frequency band in which reflection does not occur is widened.

In the power line terminating circuit and method of the invention, preferably, the inductors include first and second inductors respectively provided on each of the pair of indoor power lines, the resistors include a first resistor provided in parallel with the first inductor and a second resistor provided in parallel with the second inductor, thereby forming a balance-type (symmetrical-type) circuit. The sum of the resistance values of the first and second resistors corresponds to a characteristic impedance of the indoor power lines, and the first and second inductors configure the series resonance circuit in cooperation with the first capacitor. With the configuration, radiation noise is reduced. More preferably, the first and second inductors have inductances equal to each other, and the first and second resistors have resistance values equal to each other. With the configuration, the power line terminating circuit becomes a complete balance type, so that radiation noise is further reduced. More preferably, the power line terminating circuit further includes: a third capacitor provided in series with the first resistor and configuring a first parallel resonance circuit in cooperation with the first inductor; and a fourth capacitor provided in series with the second resistor and configuring a second parallel resonance circuit in cooperation with the second inductor. Each of the first and second parallel resonance circuits has a parallel resonance point in a frequency band which is higher than the series resonance point of the series resonance circuit and is lower than the communication frequency band. In a manner similar to the case of adding the second capacitor to the unbalanced-type power line terminating circuit, the frequency at which the input impedance of the power line terminating circuit reaches a predetermined value shifts to the lower side. As a result, the frequency band in which no reflection occurs is widened.

The present invention also provides a power line relay device for relaying between terminations of a pair of indoor power lines where a high frequency signal in a communication frequency band is superimposed on an AC power source voltage and an electric device which is supplied with power from the indoor power lines, including: a pair of connection plugs connectable to the terminations of the pair of indoor power lines; a pair of electric-device-connection sockets to which a power source plug of the electric device can be plugged in; a first capacitor provided between the pair of electric-device-connection sockets to suppress fluctuations of a capacitive load in the electric device; one or more inductors provided between the connection plug and the electric-device-connection socket and configuring a series resonance circuit in cooperation with the first capacitor; and one or more resistors provided in parallel with each of the inductors and having a resistance value corresponding to a characteristic impedance of the indoor power lines, wherein the series resonance circuit has a series resonance point in a frequency band which is higher than a frequency of the AC power source voltage and is lower than the communication frequency band.

In the power line relay device of the invention, by actions similar to those of the power line terminating circuit, the input impedance of the power line terminating circuit is equal to the characteristic impedance of the indoor power lines in the communication frequency band, and the high frequency communication signal in the communication frequency band is not reflected at the termination of the indoor power lines. Moreover, only by disposing the power line relay device of the invention like an adapter between the termination of an existing indoor power line and an electric device, actions similar to those of the power line terminating circuit can be produced.

In the power line relay device of the invention, preferably, an impedance of the inductor at the lower limit frequency of the communication frequency band is equal to or larger than twice of the resistance value of the resistor. The inductor can be provided on either between one of the connection plugs and one of the electric-device-connection sockets or between the other connection plug and the other electric-device-connection socket. In this case, preferably, the power line relay device further includes a second capacitor provided in series with the resistor and configuring a parallel resonance circuit in cooperation with the inductor. The parallel resonance circuit has a parallel resonance point in a frequency band which is higher than the series resonance point and is lower than the communication frequency band for the reasons similar to those described with respect to the power line terminating circuit.

In the power line relay device according to the invention, preferably, the inductor includes a first inductor provided between one of the connection plugs and one of the electric-device-connection sockets, and a second inductor provided between the other connection plug and the other electric-device-connection socket, the resistor includes a first resistor provided in parallel with the first inductor and a second resistor provided in parallel with the second inductor, the sum of the resistance values of the first and second resistors corresponds to a characteristic impedance of the indoor power lines, and the first and second inductors configure the series resonance circuit in cooperation with the first capacitor. In this case, more preferably, the first and second inductors have inductances equal to each other, and the first and second resistors have resistance values equal to each other. More preferably, the power line relay device according to the invention further includes: a third capacitor provided in series with the first resistor and configuring a first parallel resonance circuit in cooperation with the first inductor; and a fourth capacitor provided in series with the second resistor and configuring a second parallel resonance circuit in cooperation with the second inductor. Each of the first and second parallel resonance circuits has a parallel resonance point in a frequency band which is higher than the series resonance point of the series resonance circuit and is lower than the communication frequency band for the reasons similar to those described with respect to the power line terminating circuit.

The power line relay device according to the invention may further include at least a pair of communication device connection sockets which are directly connected to the terminations of the pair of indoor power lines and to which a power source plug of a communication device is plugged in. In this case, not only an electric device but also a communication device can be connected to a single power line termination. The power line relay device may further include at least a pair of electric device adding connection sockets which are provided in parallel with the pair of electric-device-connection sockets and to which a power source plug of an electric device can be plugged in. In this case, a communication device and a plurality of electric devices can be connected to a single power line termination.

BEST MODE FOR CARRYING OUT THE INVENTION

Embodiments of the invention will now be described in detail hereinbelow by referring to the drawings.

First Embodiment

First, a power line terminating circuit according to a first embodiment of the invention will be described. Since a power line terminating method according to an embodiment of the invention is embodied by the power line terminating circuit of the embodiment, it will be also described below.

Figure 1:
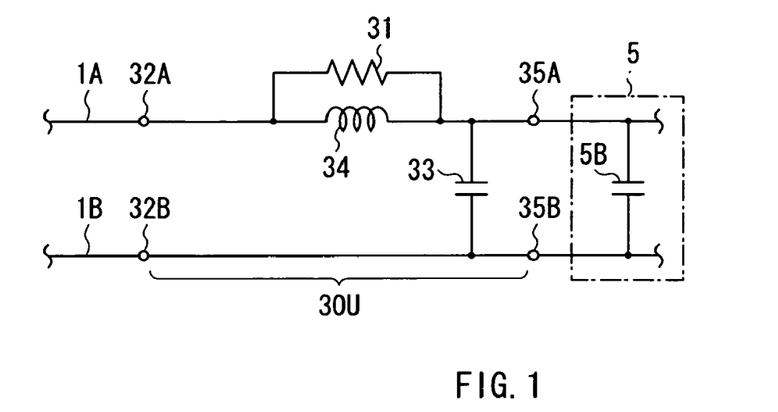
FIG. 1 is a circuit diagram showing the configuration of a power line terminating circuit according to a first embodiment of the invention.

FIG. 1 shows a circuit configuration of the power line terminating circuit in the embodiment. A power line terminating circuit 30U is applied to, for example, indoor wiring of a general house shown in FIG. 12 and is provided in an outlet (for example, the outlets 2C and 2D in the branch parts B1 and B2 in FIG. 12) provided in an indoor wall. As shown in FIG. 1, the power line terminating circuit 30U is provided between terminations 32A and 32B of a pair of indoor power lines 1A and 1B and a pair of connection terminals 35A and 35B. In this case, the terminations 32A and 32B are wiring ends in wall outlets, and the pair of connection terminals 35A and 35B are socket terminals to which the power source plug 5A (FIG. 12) of the electric device 5 is connected. Commercial AC power is supplied from the indoor power lines 1A and 1B to the electric device 5 via the socket terminal.

The electric device 5 is a general household electric appliance such as a microwave or a television receiver which is not assumed to perform power line communication (or does not have the power line communication function). The capacitor 5B is, for example, a capacitor of a line filter provided at the input stage of the electric device 5 or a parasitic line-capacitance of wiring in the electric device 5.

The pair of indoor power lines 1A and 1B is provided to supply the commercial AC voltage (AC 100V) of 50 Hz or 60 Hz to the electric device 5 and the like. A high frequency signal in the communication frequency band transmitted from the transmitter 3 connected to the outlet 2A in FIG. 12 is superimposed on the indoor power lines 1A and 1B, and the resultant is transmitted to the receiver 4 (FIG. 12) connected to the outlet 2B.

Each of the transmitter 3 and the receiver 4 has a modem (modulator/demodulator) for power lines, receives power supply of the commercial power source from the indoor power lines 1A and 1B, and can operate. In the case of performing communications, the transmitter 3 modulates a transmission signal to a communication signal of a high frequency by using carrier waves in a communication frequency band (for example, 4 MHz to 21 MHz) sufficiently higher than the commercial power source frequency (50 Hz or 60 Hz) by the built-in modem, superimposes the resultant on the indoor power lines 1A and 1B, and transmits the resultant signal to the receiver 4. The receiver 4 receives the high-frequency communication signal transmitted on the indoor power lines 1A and 1B, and demodulates the signal to a reception signal by an internally provided modem. As a modulating method, for example, the OFDM (Orthogonal Frequency Division Multiplexing) is used.

The power line terminating circuit 30U has a capacitor 33 provided between a pair of connection terminals 35A and 35B, an inductor 34 provided between the termination 32A of the indoor power line 1A as one of the indoor power lines and the connection terminal 35A as one of the connection terminals, and a resistor 31 provided in parallel with the inductor 34. The capacitor 33 corresponds to a concrete example of "first capacitor" in the present invention.

The resistor 31 has a resistance value R corresponding to a characteristic impedance Z of the indoor power lines 1A and 1B. The capacitor 33 is provided to suppress fluctuations in the capacitive load in the electric device 5 and will be described later.

The inductor 34 and the capacitor 33 constitute a series resonance circuit. The series resonance circuit has a series resonance point in the frequency band higher than the frequency (for example, the commercial power source frequency of 50 Hz or 60 Hz) of the AC power source voltage and lower than the communication frequency band (for example, 4 MHz to 21 MHz) of high frequencies. Preferably, the impedance of the inductor 34 in the lower limit frequency (for example, 4 MHz) of the communication frequency band is at least twice as large as the resistance value of the resistor 31.

The operation of the power line terminating circuit 30U with such a configuration will now be described.

First, the operation of supplying power to the electric device 5 will be descried. At the commercial power source frequency (50 Hz or 60 Hz), the impedance of the inductor 34 is a very small value, so that most of currents do not pass through the resistor 31 but pass through the inductor 34. Since the impedance of the capacitor 33 is very large, the current hardly flows in the capacitor 33. Therefore, in the case where the electric device 5 is connected to the indoor power lines 1A and 1B via the power line terminating circuit 30U, power can be supplied to the electric device 5 without any problem.

The operations performed in the case where power line communication is performed between the transmitter 3 and the receiver 4 in FIG. 12 by using the indoor power lines 1A and 1B will now be described.

When the power line communication is performed between the transmitter 3 and the receiver 4 in a state where the electric device 5 is not connected to the power line terminating circuit 30U, a high frequency signal (communication signal) in the communication frequency band is transferred on the indoor power lines 1A and 1B. In such a high frequency band, the impedance of the inductor 34 becomes high, so that most of the currents pass through the resistor 31. Since the impedance of the capacitor 33 is very low, the currents passed through the resistor 31 pass through the capacitor 33. Therefore, the indoor power lines 1A and 1B are approximated by the resistance value R of the resistor 31 equal to the characteristic impedance Z of the power line, and reflection of the communication signal in the power line terminating circuit 30U is suppressed. That is, deterioration in the communication quality by open stub can be effectively avoided.

To make most of the currents pass through the resistor 31 in the communication frequency band, desirably, the impedance of the inductor 34 is as high as possible. As described above, it is preferable to set the impedance of the inductor 34 at the lowest frequency (for example, 4 MHz) of the communication frequency band to be at least twice as high as the resistance value of the resistor 31 to make the resistor 31 provided in parallel with the inductor 34 function as a reliable bypass to a high frequency signal of the communication frequency band.

No passage of currents to the electric device 5 connected to the power line terminating circuit 30U in the communication frequency band denotes that a communication signal does not exert an influence on the electric device 5. It means suppression of the influence of noise occurring in the electric device 5 onto the indoor power lines 1A and 1B, that is, attenuation of device noise on the indoor power line. The noise attenuation amount is larger than that in the case of Japanese Patent Laid-open No. 2002-217797 and is excellent in the noise reduction effect. When attention is paid to the filter characteristic around the cut-off frequency, the frequency characteristic of Japanese Patent Laid-open No. 2001-217797 is the characteristic of a primary filter. In contrast, the characteristic of the power line terminating circuit is the characteristic of a secondary filter.

On the other hand, in a state where the electric device 5 is connected to the power line terminating circuit 30U, the capacitor 5B existing in the electric device 5 is connected in parallel with the capacitor 33. When the power line communication is performed between the transmitter 3 and the receiver 4 in this state and a high frequency signal (communication signal) of the communication frequency band is transferred on the indoor power lines 1A and 1B, reflection occurs in the resonance point (resonance frequency) of a series resonance circuit configured by a combined capacitance of the two capacitors 5B and 33 and the inductor 34. The resonance point is, however, shifted to the low frequency side as compared with the case where a series resonance circuit is configured by the single capacitor 5B and the inductor 34 only by the amount of the existence of the capacitor 33. Therefore, by properly setting the value of the capacitor 33, the resonance point of the series resonance circuit can be made completely out from the communication frequency band. In this case, no reflection occurs in the power line terminating circuit 30U at least in the communication frequency band. That is, a communication signal is not influenced by short stub caused by the existence of the electric device 5, so that degradation of the communication quality is avoided.

Figure 2:
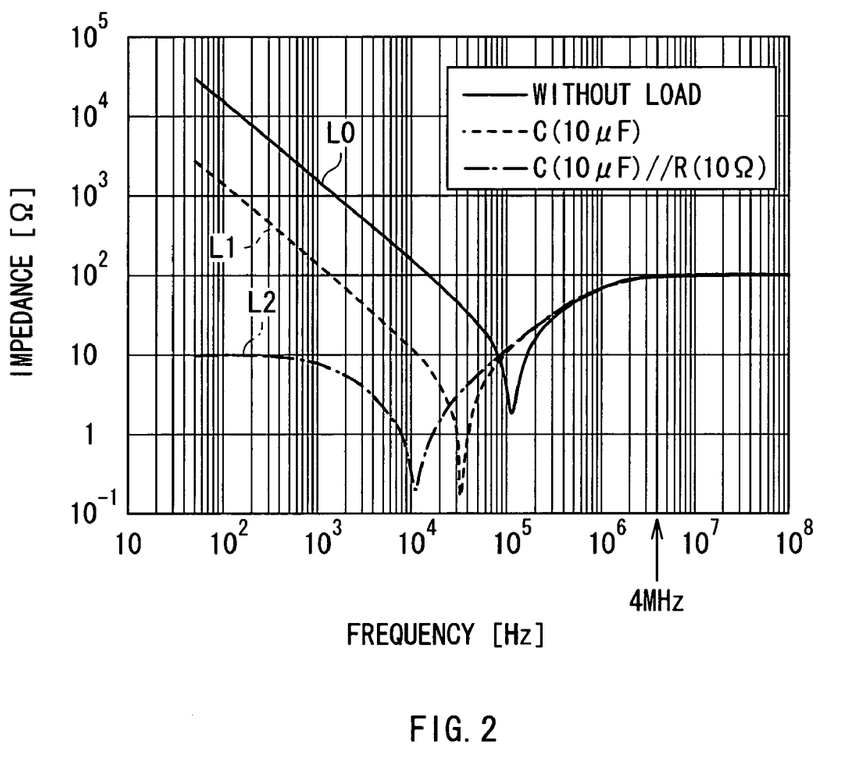
FIG. 2 is a characteristic diagram showing the relation between an input frequency and an input impedance in the case where a load connected to the power line terminating circuit in FIG. 1 is changed.

FIG. 2 shows the relation between the input frequency and the input impedance of the power line terminating circuit 30U in the case where the load (the electric device 5) connected to the power line terminating circuit 30U is changed. The horizontal axis denotes frequency, and the vertical axis indicates impedance. A solid line L0 shows the case without load, a broken line L1 shows the case where the load is a capacitance of 10 μF (microfarad), and an alternate long and short dash line L2 indicates the case where a capacitance of 10 μF as a load and a resistor of 10Ω (ohm) are connected in parallel. In this example, it is assumed that the characteristic impedance Z of the indoor power lines 1A and 1B is 100Ω. FIG. 2 shows an example of the case where the circuit parameters shown in FIG. 1 are set to the following values.

Inductance of the inductor 34=20 μH (micro Henry)
Capacitance of the capacitor 33=0.1 μF
Resistance value of the resistor 31=100Ω

As obvious from FIG. 2, in this example, in the frequency band of 4 MHz or higher, irrespective of the presence or absence and the kind of a load, there is no fluctuation in the input impedance of the power line terminating circuit 30U. The input impedance is kept to the same constant value (100Ω in this case) as that of the characteristic impedance Z. Therefore, when the communication band is 4 MHz or higher, no reflection occurs in the power line terminating circuit 30U.

Figure 3:
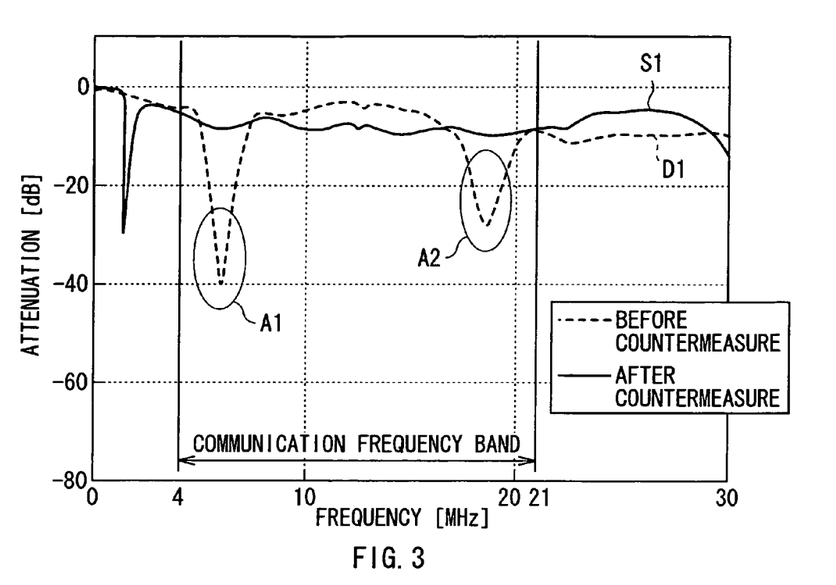
FIG. 3 is a characteristic diagram showing comparison of the relation between the frequency and the attenuation amount before and after a countermeasure against open stub countermeasure by the power line terminating circuit in FIG. 1.
Figure 4:
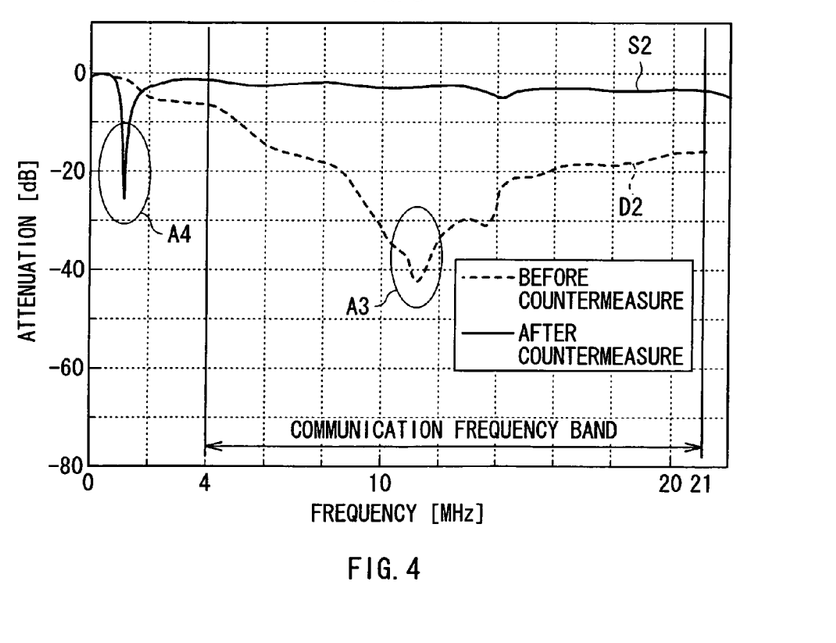
FIG. 4 is a characteristic diagram showing comparison of the relation between the frequency and the attenuation amount before and after a countermeasure against short stub by the power line terminating circuit in FIG. 1.

FIGS. 3 and 4 show the relation between the frequency and the attenuation amount of a signal transferred on the indoor power lines 1A and 1B. FIG. 3 shows comparison of signal characteristics before and after a countermeasure against an open stub in the case where no electric devices are connected to the branch parts B1 and B2 of the indoor power lines 1A and 1B (outlets 2C and 2D are open ends). FIG. 4 shows comparison of signal characteristics before and after a countermeasure against a short stub in the case where electric devices are connected to the branch parts B1 and B2 of the indoor power lines 1A and 1B (outlets 2C and 2D are not open ends). In the diagrams, the horizontal axis indicates frequency [MHz], and the vertical axis indicates the attenuation amount [dB]. The countermeasure against an open stub and the countermeasure against a short stub denote here that the power line terminating circuit 30U is provided in the branch parts B1 and B2 (FIG. 12) of the indoor power lines 1A and 1B.

In the case where the countermeasure against an open stub is not taken, that is, in the case where the power line terminating circuit 30U is not provided on the branch parts B1 and B2 (FIG. 12) of the indoor power lines 1A and 1B, as shown by a broken line D1 in FIG. 3, narrow and deep attenuation poles A1 and A2 occur in parts of the communication frequency band due to reflection at the terminations (outlets 2A and 2B) of the branch parts B1 and B2. As a result, communication quality deteriorates.

On the other hand, in the case where the countermeasure against an open stub is taken, that is, in the case where the power line terminating circuit 30U is provided in the branch parts B1 and B2 of the indoor power lines 1A and 1B, as shown by a solid line S1 in FIG. 3, no reflection occurs at the terminations (outlets 2A and 2B) of the branch parts B1 and B2, so that no attenuation poles occur in the whole communication frequency band. As a result, deterioration of the communication quality is avoided.

In the case where the countermeasure against a short stub is not taken, that is, in the case where the power line terminating circuit 30U is not provided in the branch parts B1 and B2 (FIG. 12) of the indoor power lines 1A and 1B, as shown by a broken line D2 in FIG. 4, a large and deep attenuation pole A3 occurs in the center portion of the communication frequency band due to reflection at the terminations (outlets 2A and 2B) of the branch parts B1 and B2. As a result, the communication quality deteriorates.

On the other hand, in the case where the countermeasure against a short stub is taken, that is, in the case where the power line terminating circuit 30U is provided on the branch parts B1 and B2 (FIG. 12) in the indoor power lines 1A and 1B, as shown by a solid line S2 in FIG. 4, an attenuation pole A4 caused by reflection at the terminations (outlets 2A and 2B) of the branch parts B1 and B2 shifts to a frequency band lower than the communication frequency band, so that no influence is exerted on the communication quality.

As described above, according to the embodiment, the series resonance circuit having the series resonance point in the frequency band higher than the frequency of the AC power source voltage and lower than the communication frequency band of the high frequency is configured by the capacitor 33 provided between the pair of connection terminals 35A and 35B and the inductor 34 provided between the termination 32A of the indoor power line 1A as one of the indoor power lines and the connection terminal 35A as one of the connection terminals, and the resistor 31 having the resistance value corresponding to the characteristic impedance of the indoor power lines 1A and 1B is provided in parallel with the inductor 34, so that fluctuations in the capacitive load in the communication frequency band can be suppressed. That is, irrespective of the presence or absence and the kind of a load (the electric device 5), the input impedance of the power line terminating circuit 30U can be maintained constant in the communication frequency band. Therefore, irrespective of whether the general electric device 5 or the like other than the communication devices (the transmitter 3 and the receiver 4) are connected to the indoor power lines 1A and 1B or not or the kind of an electric device connected, occurrence of reflection by mismatching of impedances in the power line terminating circuit 30U can be prevented in the communication band, and deterioration in the communication quality can be effectively avoided.

In the power line terminating circuit of the embodiment, the communication signals on the indoor power lines 1A and 1B are prevented from exerting an influence on the electric device 5. Consequently, the influence of noise occurring in the electric device 5 or the like can be also suppressed, and power line communication having resistance to device noise can be realized.

Next, some modifications of the embodiment will be described.

Although the case where the power line terminating circuit 30U is provided in the outlet of the inner wall of a general house has been described as an example of the foregoing embodiment, the invention is not limited to the case. For example, as shown in FIGS. 5A and 5B to FIGS. 7A and 7B, the invention can be also embodied as an adapter-type power line relay device which can be plugged in an outlet having no such a power line terminating circuit. In the diagrams, the same reference numerals are designated to components having the same configuration as those shown in FIG. 1 and their description will not be repeated.

First Modification

Figure 5A:
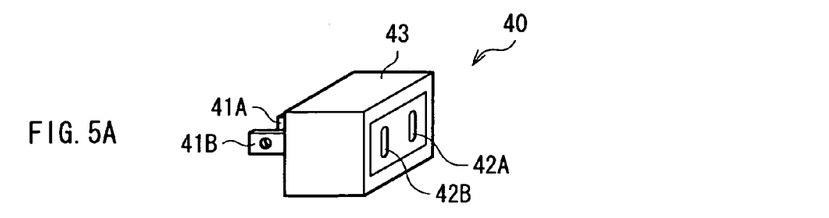
FIGS. 5A and 5B are an outside structure diagram and a circuit diagram, respectively, showing the configuration of a power line relay device according to a first modification of the first embodiment.
Figure 5B:
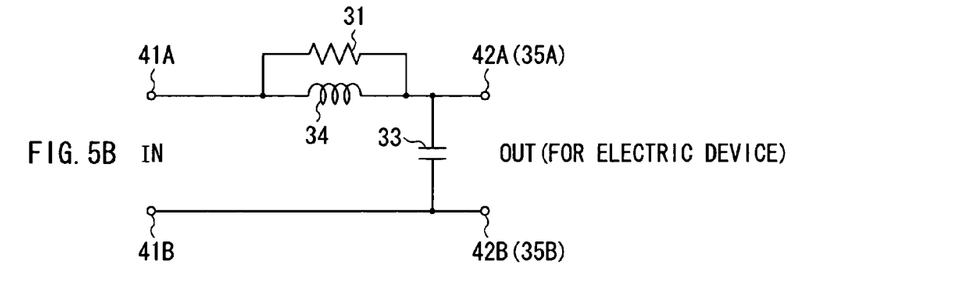

FIGS. 5A and 5B show a power line relay device according to a first modification of the embodiment as an example where an input and an output are provided in a one-to-one correspondence manner. FIG. 5A shows an outside structure, and FIG. 5B shows a circuit configuration.

A power line relay device 40 is provided to relay power supply from existing outlets (for example, the outlet 2C in FIG. 12) of the indoor power lines 1A and 1B to the electric device 5. The "existing outlet" is not preliminarily provided on assumption of performing the power line communication but a conventional normal outlet used in a general house.

As shown in FIGS. 5A and 5B, the power line relay device 40 has a pair of connection plugs 41A and 41B functioning as an input terminal IN, a pair of electric-device-connection sockets 42A and 42B functioning as an output terminal OUT, and a casing 43 housing a power line terminating circuit having the configuration shown in FIG. 5B. The power line terminating circuit of FIG. 5B is substantially the same as that shown in FIG. 1.

The connection plugs 41A and 41B are inserted to a pair of not-shown connection sockets in the outlet 2C and the like (FIG. 12). To the electric-device-connection sockets 42A and 42B, the pair of power source plugs 5A (FIG. 12) of the electric device 5 is to be inserted. The electric-device-connection sockets 42A and 42B correspond to the connection terminals 35A and 35B in FIG. 1, respectively.

By connecting the electric device 5 to the outlet 2C or the like of the indoor power lines 1A and 1B via the power line relay device 40, a power line terminating circuit is formed at the terminations of the indoor power lines 1A and 1B. As a result, functions similar to those of the foregoing embodiment are displayed. That is, occurrence of reflection due to impedance mismatching at the power line terminations can be prevented in the communication band.

In the modification, by using the power line relay device 40 as an adapter at the time of connecting the electric device 5 or the like to the outlet 2C or the like, the existing indoor power lines 1A and 1B (which are not provided on assumption of power line communication) can be changed to communication paths adapted to the power line communication. That is, it is extremely easy to configure a power line communication system by using existing equipment, so that a special work is not necessary.

Modification 2

Figure 6A:
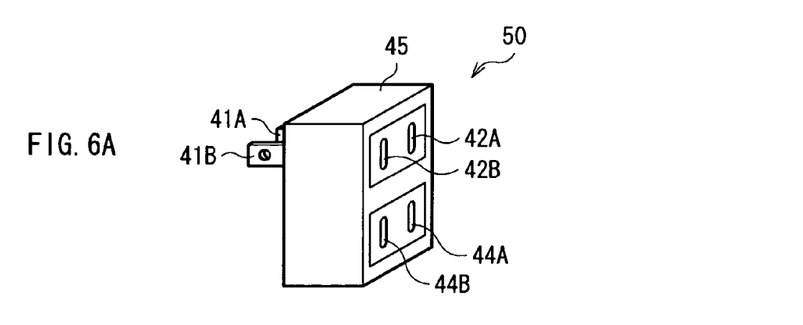
FIGS. 6A and 6B are an outside structure diagram and a circuit diagram, respectively, showing the configuration of a power line relay device according to a second modification of the first embodiment.
Figure 6B:
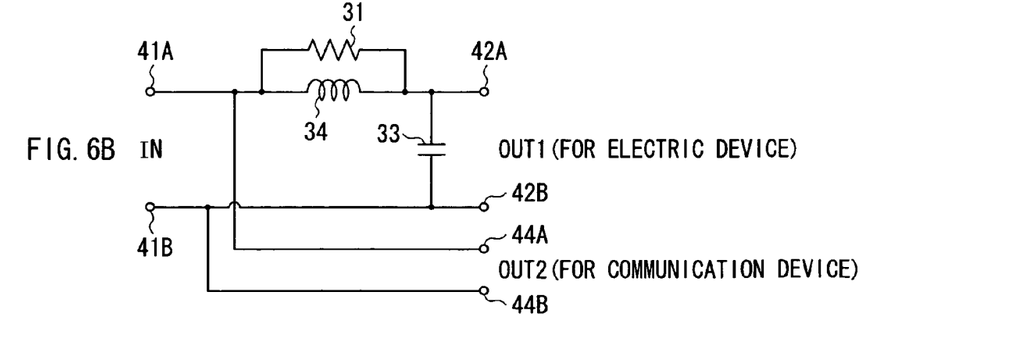

FIGS. 6A and 6B show a power line relay device according to a second modification of the embodiment as an example where one input and two outputs are provided. FIG. 6A shows an outside structure, and FIG. 6B shows a circuit configuration. The same reference numerals are designated to the same components as those shown in FIGS. 5A and 5B and their description will not be repeated.

A power line relay device 50 is provided to relay power supply from, for example, the outlet 2A (FIG. 12) as the terminations of the indoor power lines 1A and 1B to the communication device (transmitter 3, receiver 4, or the like) and the electric device 5, and to relay a communication signal among the communication devices and the indoor power lines 1A and 1B.

The power line relay device 50 has the pair of electric-device-connection sockets 42A and 42B functioning as a first output terminal OUT1 and, in addition, a pair of communication device connection sockets 44A and 44B functioning as a second output terminal OUT2. The power line relay device 50 also has, in place of the casing 43 (FIG. 5A), a casing 45 housing a power line terminating circuit having a configuration shown in FIG. 6B. The power line terminating circuit of FIG. 6B is substantially the same as that shown in FIG. 5B except for the point that the communication device connection sockets 44A and 44B as the second output terminal OUT2 are directly connected to the pair of connection plugs 41A and 41B as the input terminal IN.

To the pair of electric-device-connection sockets 42A and 42B as the first output terminal OUT1, the pair of power source plugs 5A (FIG. 12) of the electric device 5 is to be inserted. To the pair of electric-device-connection sockets 44A and 44B as the second output terminal OUT2, the power source plug (the power source plug 3A of the transmitter 3 or the power source plug 4A of the receiver 4) of the communication device is inserted. In the case where a transmitter or the like does not have therein a modem, a power source plug of an external power line communication modem provided between the indoor power lines 1A and 1B and the transmitter or the like is inserted to the communication device connection sockets 44A and 44B.

By connecting the electric device 5 to the indoor power lines 1A and 1B via the electric-device-connection sockets 42A and 42B of the power line relay device 50, a power line terminating circuit is formed at the terminations (outlet 2A or the like) of the indoor power lines 1A and 1B. As a result, occurrence of reflection due to impedance mismatching at the power line terminations to which the electric device 5 is connected can be prevented in the communication band.

On the other hand, by connecting the communication device such as the transmitter 3 to the indoor power lines 1A and 1B by using the communication device connection sockets 44A and 44B of the power line relay device 50, a communication path adapted to the power line communication among communication devices can be configured.

In the modification, by using the power line relay device 50, even the existing indoor power lines 1A and 1B can connect the electric device 5 and the communication device to the same outlet 2A without causing deterioration in communication quality.

Modification 3

Figure 7A:
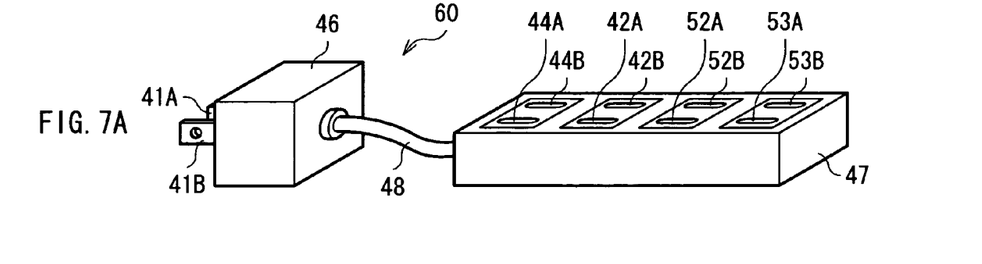
FIGS. 7A and 7B are an outside structure diagram and a circuit diagram, respectively, showing the configuration of a power line relay device according to a third modification of the first embodiment.
Figure 7B:
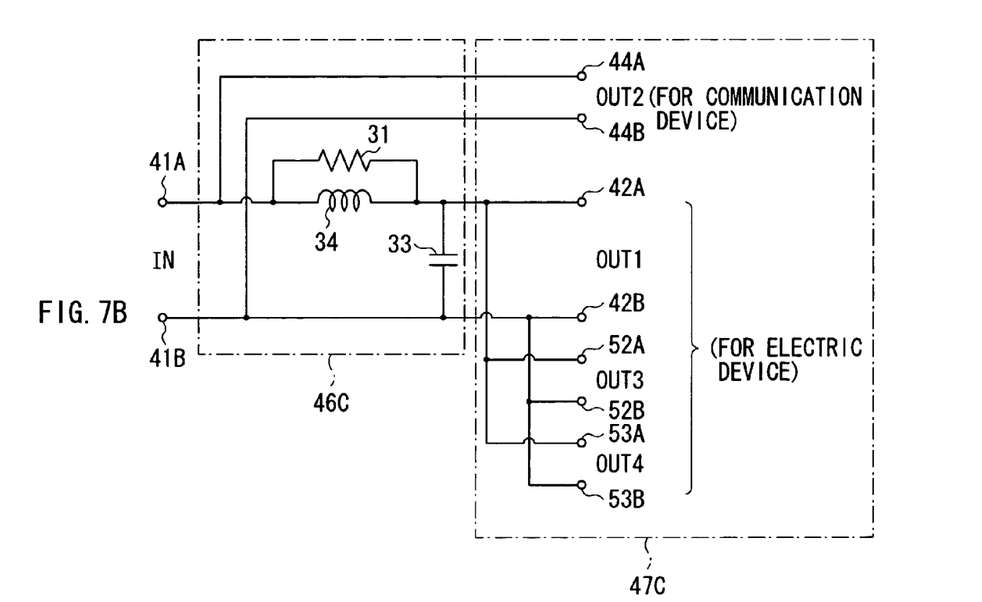

FIGS. 7A and 7B show a power line relay device according to a third modification of the embodiment as an example where one input and four outputs are provided. FIG. 7A shows an outside structure, and FIG. 7B shows a circuit configuration. The same reference numerals are designated to the same components as those shown in FIGS. 6A and 6B and their description will not be repeated.

A power line relay device 60 is provided to relay power supply from, for example, the outlet 2A (FIG. 12) as the terminations of the indoor power lines 1A and 1B to the communication device (transmitter 3, receiver 4, or the like) and a plurality of electric devices, and to relay a communication signal among the communication devices and the indoor power lines 1A and 1B.

The power line relay device 60 has a casing 46 housing a power line terminating circuit 46C shown in FIG. 7B, a casing 47 housing an output circuit 47C having first to fourth output terminals OUT1 to OUT4 shown in FIG. 7B, and a cable 48 connecting the power line terminating circuit 46C and the output circuit 47C. The pair of electric-device-connection sockets 42A and 42B functions as a first output terminal OUT1 and the pair of communication device connection sockets 44A and 44B functions as a second output terminal OUT2. Electric device adding connection sockets 52A and 52B function as a third output terminal OUT3, and electric device adding connection sockets 53A and 53B function as a fourth output terminal OUT4.

Power source plugs such as the electric device 5 are connected to the first output terminal OUT1 and the third and fourth output terminals OUT3 and OUT4, and a power source plug of a communication device such as the transmitter 3, the receiver 4, or a power line communication modem is connected to the second output terminal OUT2.

In the modification, a communication device is connected to the indoor power lines 1A and 1B by using the output terminal OUT2 of the power line relay device 60, and a plurality of (in this case, the maximum three) electric devices can be connected to the indoor power lines 1A and 1B by using the output terminals OUT1, OUT3, and OUT4. In this case as well, the power line terminating circuit 46C similar to that in FIG. 1 is formed in the terminations (output terminals OUT1, OUT3, and OUT4) of the indoor power lines 1A and 1B. Thus, reflection of the communication signal in the communication frequency band can be prevented, and a communication path adapted to the power line communication among communication devices can be easily configured.

Second Embodiment

Next, a power line terminating circuit in a second embodiment of the invention will be described.

Figure 8:
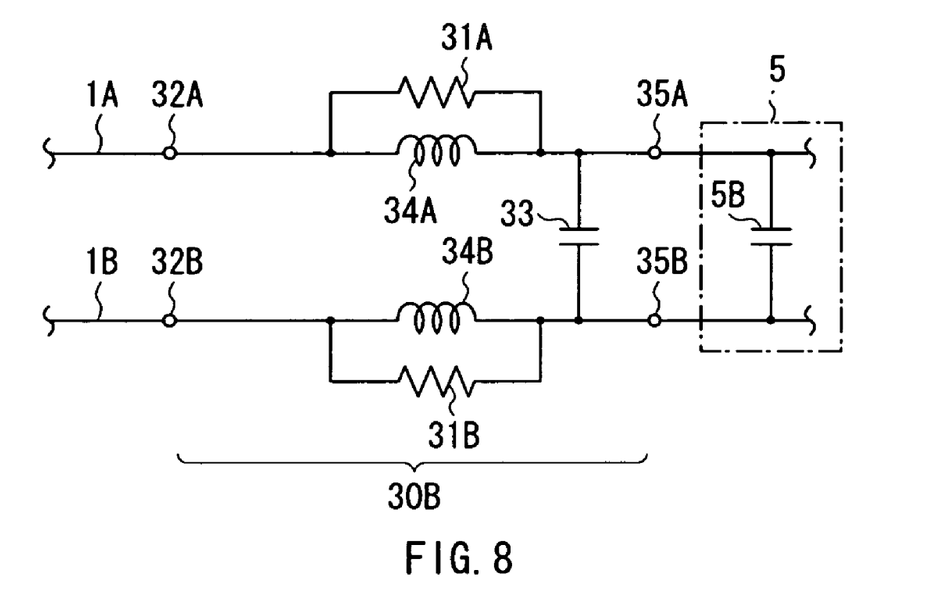
FIG. 8 is a circuit diagram showing the configuration of a power line terminating circuit according to a second embodiment of the invention.

FIG. 8 shows the configuration of a power line terminating circuit of the second embodiment. In the diagram, the same reference numerals are designated to the parts substantially the same as those shown in FIG. 1 and their description will not be repeated.

In the first embodiment, the power line terminating circuit 30U of a so-called unbalanced type in which an inductor and a resistor are provided only in one of the pair of indoor power lines 1A and 1B has been described. In contrast, a power line terminating circuit 30B of the embodiment has a so-called balanced configuration in which an inductor and a resistor are disposed for each of the pair of indoor power lines 1A and 1B are disposed as shown in FIG. 8.

The power line terminating circuit 30B has the capacitor 33 provided between the pair of connection terminals 35A and 35B, a first inductor 34A provided between the termination 32A of the indoor power line 1A as one of indoor power lines and the connection terminal 35A as one of connection terminals, a first resistor 31A provided in parallel with the first inductor 34A, a second inductor 34B provided between the termination 32B of the other indoor power line 1B and the other connection terminal 35B, and a second resistor 31B provided in parallel with the second inductor 34B.

Each of the first and second resistors 31A and 31B has a resistance value which is the half of the resistance value R of the resistor 31 in FIG. 1 (that is, the resistance value of the half of the characteristic impedance Z of the indoor power line), and the sum of the resistance values of the first and second resistors 31A and 31B is equal to the characteristic impedance Z of the indoor power line.

Each of the first and second inductors 34A and 34B has inductance which is the half of the inductance of the inductor 34 shown in FIG. 1, and the first and second inductors 34A and 34B configure a serial resonance circuit in cooperation with the capacitor 33. The series resonance circuit has a series resonance point in a frequency band which is higher than the frequency of the AC power source voltage and is lower than the communication frequency band.

The other configuration and the connection relation are similar to those in the case of FIG. 1.

In the power line terminating circuit 30B of the embodiment, the inductor 34 in the first embodiment (FIG. 1) is divided into the two inductors 34A and 34B having the same inductance which are disposed so as to be equally assigned to the pair of indoor power lines 1A and 1B. Consequently, the series resonance circuit configured by the two inductors 34A and 34B and the capacitor 33 has the configuration of the balanced type and can reduce radiation noise more than the first embodiment.

As described above, it is the most preferable that the resistors 31A and 31B have the same resistance value and the two inductors 34A and 34B have the same inductance, that is, the circuit parameters are completely the same. However, the circuit parameters do not have to be completely the same but may be different from each other. When reduction in the radiation noise is considered, however, it is desirable to set a deviation of the similarity to be within about 30%.

Third Embodiment

Next, a power line terminating circuit in a third embodiment of the invention will be described.

Figure 9:
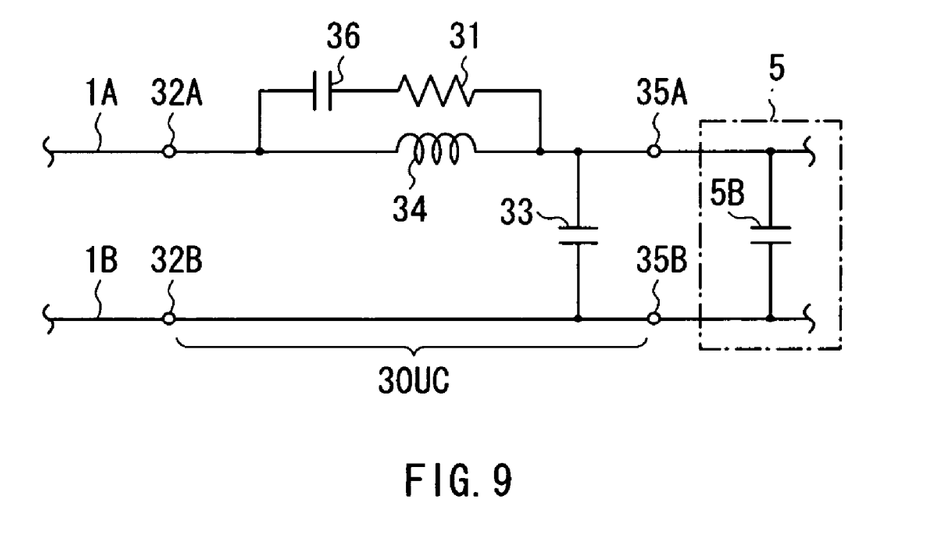
FIG. 9 is a circuit diagram showing the configuration of a power line terminating circuit according to a third embodiment of the invention.

FIG. 9 shows the configuration of a power line terminating circuit of the third embodiment. In the diagram, the same reference numerals are designated to the parts substantially the same as those shown in FIG. 1 and their description will not be repeated.

As shown in FIG. 9, a power line terminating circuit 30UC of the third embodiment has the power line terminating circuit 30U of the first embodiment (FIG. 1) and, in addition, a second capacitor 36 connected to the resistor 31 in series. The capacitor 36 and the inductor 34 configure a parallel resonance circuit. In this case, the capacitance of the capacitor 36 is set so that the resonance frequency of the parallel resonance circuit has a parallel resonance point higher than the series resonance point of the series resonance circuit configured by the first and second inductors 34A and 34B and lower than the communication frequency band. Concretely, it is preferable to set the resonance frequency of the parallel resonance circuit to be slightly lower than the lower limit (for example, 4 MHz) of the communication frequency. The other configuration and the connection relation are similar to those in the case of FIG. 1.

Figure 10:
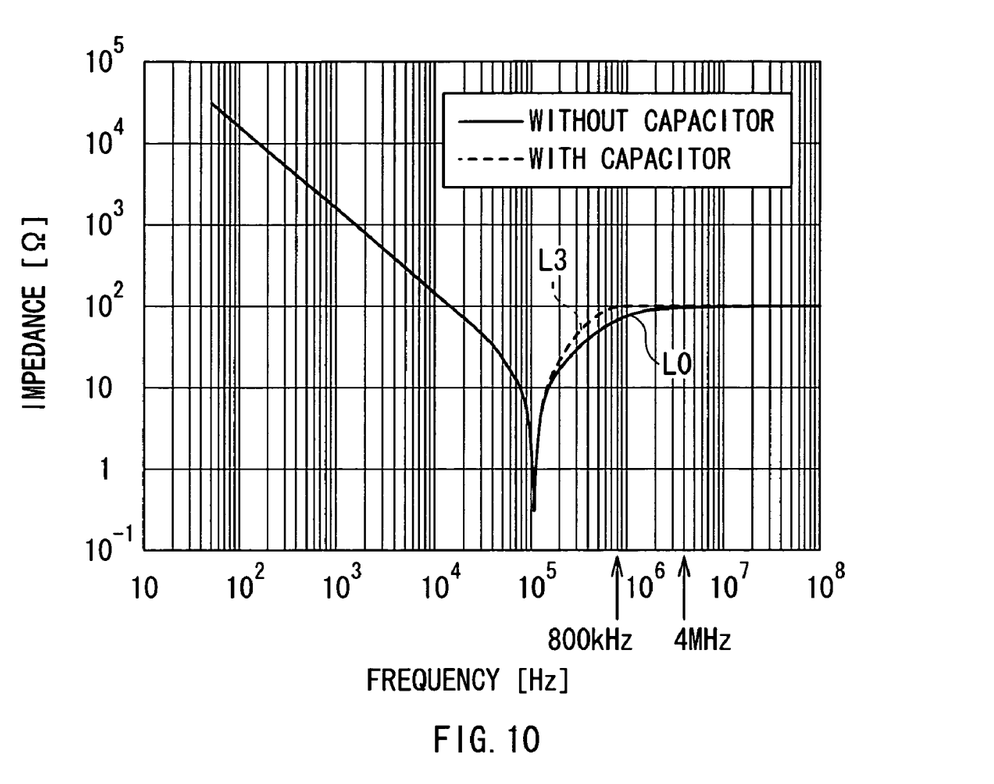
FIG. 10 is a characteristic diagram showing comparison of the relation between the frequency and the impedance characteristic between the power line terminating circuit in FIG. 1 and that in FIG. 9.

FIG. 10 shows comparison of the relation between the input frequency and the input impedance of the power line terminating circuit 30UC shown in FIG. 9 (in the case where there is the second capacitor 36) and that in the case of the first embodiment (in the case where there is no second capacitor 36; FIG. 1). The horizontal axis denotes frequency, and the vertical axis indicates impedance. Both of the solid line L0 and the broken line L3 show the case where there is no load in FIGS. 1 and 9 (the case where no electric devices are connected). It is assumed that the characteristic impedance R of the indoor power lines 1A and 1B is 100Ω. FIG. 10 shows an example of the case where the circuit parameters shown in FIGS. 1 and 9 are set to the following values.

Inductance of the inductor 34=20 μH
Capacitance of the capacitor 33=0.1 μF
Capacitance of the capacitor 36=4 nF (nanofarad)
Resistance value of the resistor 31=100Ω

As obvious from FIG. 10, the desired input impedance is reached in the case of the power line terminating circuit 30UC in FIG. 9 at a frequency lower than that in the case of the power line terminating circuit 30U in FIG. 1 (the characteristic impedance Z of the indoor power lines 1A and 1B=100Ω). In the example shown in FIG. 10, the frequency at which the input impedance reaches 100Ω is about 4 MHz in the case of FIG. 1. On the other hand, it is about 800 kHz in the case of FIG. 9. That is, the lower limit of the frequency at which communication can be performed shifts from 4 MHz to about 800 kHz. It is understood that the frequency band which can be used for communication is enlarged.

Fourth Modification

Figure 11:
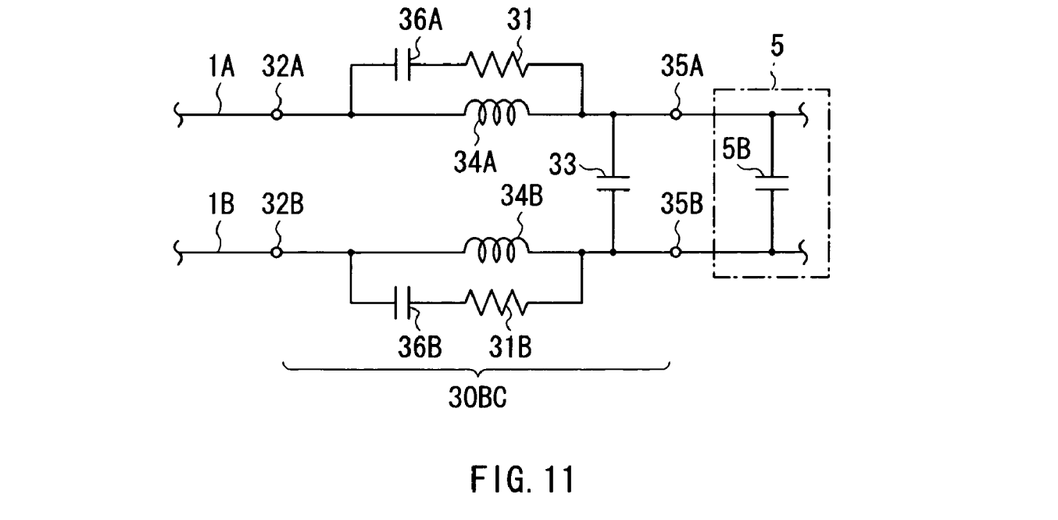
FIG. 11 is a circuit diagram showing the configuration of a power line terminating circuit according to a modification of the third embodiment.

In the third embodiment (FIG. 9), in the unbalanced-type power line terminating circuit 30U (FIG. 1) in the first embodiment, further, the second capacitor 36 is provided in series with the resistor 31. Alternately, a power line terminating circuit 30BC as shown in FIG. 11 may be also configured by further providing the balanced-type power line terminating circuit 30B (FIG. 8) in the second embodiment with third and fourth capacitors 36A and 36B in series with the resistors 31A and 31B, respectively. In this case, a first parallel resonance circuit is configured by the first inductor 34A and the third capacitor 36A, and a second parallel resonance circuit is configured by the second inductor 34B and the fourth capacitor 36B. Each of the first and second parallel resonance circuit has a parallel resonance point in a frequency band higher than the series resonance point of the series resonance circuit configured by the capacitor 33 and the first and second inductors 34A and 34B and lower than the communication frequency band. Concretely, the resistance values of the first and second resistors 31A and 31B and the inductances of the first and second inductors 34A and 34B are set to the values shown in FIG. 8. It is sufficient to set each of the third and fourth capacitors 36A and 36B to have capacitance that is twice as large as that of the second capacitor 36 shown in FIG. 9. In the modification, widening of the communication frequency and reduction of radiation noise can be simultaneously achieved.

Although the present invention has been described above by the some embodiments and modifications, the invention is not limited to the embodiments and modifications but may be variously modified. For example, in each of the embodiments (FIGS. 1, 8, and 9) and the first modification (FIGS. 5A and 5B), the power line terminating circuit is provided in the outlet on the wall side or is provided in the power line relay device disposed as an adapter between the outlet and the electric device. The invention is not limited to the cases but may be provided at an input stage in an electric device.

Although the resistor 31 and the resistors 31A and 31B are described as fixed resistors in the foregoing embodiments and modifications, a variable resistor whose resistance value can be changed according to the characteristic impedances of the indoor power lines 1A and 1B may be used.

Although each of the power line delay devices as shown in FIGS. 5A and 5B to FIGS. 7A and 7B is configured by using the power line terminating circuit 30U shown in FIG. 1 in the first to third modifications, the invention is not limited to the configurations. For example, the power line relay devices as shown in FIGS. 5A and 5B to FIGS. 7A and 7B can be also configured by using the power line terminating circuits with the configurations shown in FIGS. 8, 9, and 11.

Although the power line relay device having a pair of electric-device-connection sockets is illustrated in the first modification (FIGS. 5A and 5B), it may also have two or more pairs of communication device connection sockets.

Although the power line relay device having a pair of communication device connection sockets is illustrated in the second and third modifications (FIGS. 6A and 6B and FIGS. 7A and 7B), it may have two or more pairs of communication device connection sockets.

Although the power line relay device having three pairs of electric-device-connection sockets is illustrated in the third modification (FIGS. 7A and 7B), it may have two pairs or four or more pairs of communication device connection sockets.

The foregoing third modification (FIGS. 7A and 7B) has the structure in which the casing 46 housing the power line terminating circuit 46C and the casing 47 housing the device connection socket (the output circuit 47C including the first to fourth output terminals OUT1 to OUT4) are provided separate from each other and are connected to each other via the cable 48. Alternately, the invention is not limited to the structure, but the casings 46 and 47 may be also integrally provided as a single casing.

The values of the circuit parameters, the values of the characteristic impedances of the indoor power lines, and the like in the foregoing embodiments are just an example, and the invention is not limited to the values.

As described above, in the power line terminating circuit and the power line relay method of the invention, between a pair of indoor power lines, a first capacitor for suppressing fluctuation in a capacitive load in an electric device connected to the termination of an indoor power line is provided. The inductor configuring the series resonance circuit in cooperation with the first capacitor is provided on the indoor power lines. The resistor having the resistance value corresponding to the characteristic impedance of the indoor power line is provided in parallel with the inductor. The series resonance circuit has a series resonance point in a frequency band higher than a frequency of the AC power source voltage and lower than a communication frequency band. Thus, reflection in the communication frequency band can be suppressed, and communication quality of the power line communication can be maintained.

In particular, when an impedance of the inductor at the lower limit frequency of the communication frequency band is set to be equal to or larger than twice of the resistance value of the resistor, the resistor provided in parallel with the inductor functions as a reliably bypass for the high frequency signal. Matching of the input impedance becomes better, so that reflection is suppressed more, and the communication quality becomes better.

When the inductor is provided on only one of the pair of indoor power lines, the second capacitor configuring the parallel resonance circuit in cooperation with the inductor is provided in series with the resistor, and the parallel resonance circuit has a parallel resonance point in a frequency band which is higher than the series resonance point of the series resonance circuit and is lower than the communication frequency band, the frequency at which the input impedance of the power line terminating circuit reaches a predetermined value (the resistance value of the resistor) shifts to the lower side. As a result, the frequency band in which reflection does not occur is widened.

The first and second inductors are respectively provided on each of the pair of indoor power lines, first and second resistors are provided in parallel with the first and second inductors, respectively, the sum of the resistance values of the first and second resistors is set equal to the characteristic impedance of the indoor power lines, and the first and second inductors configure the series resonance circuit in cooperation with the first capacitor. In this case as well, reflection in the communication frequency band can be suppressed, and the communication quality in the power line communication can be maintained. Further, in the case where the first and second inductors have inductances equal to each other, and the first and second resistors have resistance values equal to each other, the power line terminating circuit becomes the balanced type. Thus, radiation noise is reduced and the communication quality further improves. In addition, in the case where a third capacitor configuring a parallel resonance circuit in cooperation with the first inductor is provided in series with the first resistor, a fourth capacitor configuring a parallel resonance circuit in cooperation with the second inductor is provided in series with the second resistor, and each of the parallel resonance circuits has a parallel resonance point in a frequency band which is higher than the series resonance point of the series resonance circuit and is lower than the communication frequency band, the frequency at which the input impedance of the power line terminating circuit reaches a predetermined value shifts to the lower side, so that the frequency band in which no reflection occurs is widened.

A power line relay device of the invention includes: a pair of connection plugs connectable to the terminations of the pair of indoor power lines; a pair of electric-device-connection sockets to which a power source plug of the electric device can be plugged in; a first capacitor provided between the pair of electric-device-connection sockets to suppress fluctuations of a capacitive load in the electric device; an inductor provided between the connection plug and the electric-device-connection socket and configuring a series resonance circuit in cooperation with the first capacitor; and a resistor provided in parallel with the inductor and having a resistance value corresponding to a characteristic impedance of the indoor power line. The series resonance circuit has a series resonance point in a frequency band which is higher than a frequency of the AC power source voltage and is lower than the communication frequency band. Only by disposing the power line relay device with such a configuration as an adapter between the termination of an existing indoor power line and an electric device, reflection of a high frequency communication signal in a communication frequency band at the termination of the indoor power line can be suppressed. That is, without requiring a special work, an existing indoor power line can be changed to a communication path adapted to power line communications extremely easily.

The invention claimed is:

1. A power line terminating circuit provided at terminations of a pair of indoor power lines where a high frequency signal in a communication frequency band is superimposed on an AC power source voltage, comprising:
   a first capacitor provided between the pair of indoor power lines to suppress fluctuations of a capacitive load in an electric device connected to the terminations of the indoor power lines;
   one or more inductors provided on the indoor power lines and configuring a series resonance circuit in cooperation with the first capacitor; and
   one or more resistors respectively provided in parallel with each of the inductors,
   wherein the series resonance circuit has a series resonance point in a frequency band which is higher than a frequency of the AC power source voltage and is lower than the communication frequency band,
   the inductors include first and second inductors respectively provided on each of the pair of indoor power lines,
   the resistors include a first resistor provided in parallel with the first inductor and a second resistor provided in parallel with the second inductor, and
   the first and second inductors configure the series resonance circuit in cooperation with the first capacitor.

2. A power line terminating circuit according to claim 1, wherein
   the first and second inductors have inductances equal to each other, and
   the first and second resistors have resistance values equal to each other.

3. A power line terminating circuit according to claim 1, further comprising:
   a third capacitor provided in series with the first resistor and configuring a first parallel resonance circuit in cooperation with the first inductor; and
   a fourth capacitor provided in series with the second resistor and configuring a second parallel resonance circuit in cooperation with the second inductor,
   wherein each of the first and second parallel resonance circuits has a parallel resonance point in a frequency band which is higher than the series resonance point of the series resonance circuit configured by the first and second inductors and the first capacitor and is lower than the communication frequency band.

4. A power line relay device for relaying between terminations of a pair of indoor power lines where a high frequency signal in a communication frequency band is superimposed on an AC power source voltage and an electric device which is supplied with power from the indoor power lines, comprising:
- a pair of connection plugs connectable to the terminations of the pair of indoor power lines;
- a pair of electric-device-connection sockets to which a power source plug of the electric device can be plugged in;
- a first capacitor provided between the pair of electric-device-connection sockets to suppress fluctuations of a capacitive load in the electric device;
- one or more inductors provided between the connection plug and the electric-device-connection socket and configuring a series resonance circuit in cooperation with the first capacitor; and
- one or more resistors provided in parallel with each of the inductors,
- wherein the series resonance circuit has a series resonance point in a frequency band which is higher than a frequency of the AC power source voltage and is lower than the communication frequency band,
- the inductor includes a first and second inductors, the first inductor provided between one of the connection plugs and one of the electric-device-connection sockets, and the second inductor provided between the other connection plug and the other electric-device-connection socket.
- the resistor includes a first resistor provided in parallel with the first inductor and a second resistor provided in parallel with the second inductor, and
- the first and second inductors configure the series resonance circuit in cooperation with the first capacitor.

5. A power line relay device according to claim 4 wherein the first and second inductors have inductances equal to each other, and the first and second resistors have resistance values equal to each other.

6. A power line relay device according to claim 4, further comprising:
- a third capacitor provided in series with the first resistor and configuring a first parallel resonance circuit in cooperation with the first inductor; and
- a fourth capacitor provided in series with the second resistor and configuring a second parallel resonance circuit in cooperation with the second inductor,
- wherein each of the first and second parallel resonance circuits has a parallel resonance point in a frequency band which is higher than the series resonance point of the series resonance circuit configured by the first and second inductors and the first capacitor and is lower than the communication frequency band.

7. A power line relay device according to claim 4, further comprising at least a pair of communication device connection sockets which are directly connected to the pair of connection plugs and to which a power source plug of a communication device can be plugged in.

8. A power line relay device according to claim 4, further comprising at least a pair of additional electric-device-connection sockets which are provided in parallel with the pair of electric-device-connection sockets and to which a power source plug of an electric device can be plugged in.

9. A power line terminating circuit according to claim 1, wherein the sum of resistance values of the first and second resistors corresponds to a characteristic impedance of the indoor power lines.

10. A power line relay device according to claim 4, wherein the sum of resistance values of the first and second resistors corresponds to a characteristic impedance of the indoor power lines.

* * * * *